US007207029B2

United States Patent
Beale et al.

(10) Patent No.: US 7,207,029 B2
(45) Date of Patent: Apr. 17, 2007

(54) CALCULATING ETCH PROXIMITY-CORRECTION USING IMAGE-PRECISION TECHNIQUES

(75) Inventors: Dan Beale, Portland, OR (US); Jim Shiely, Aloha, OR (US); John Stirniman, Vancouver, WA (US)

(73) Assignee: Synopsys, Inc., Mountain View, CA (US)

( * ) Notice: Subject to any disclaimer, the term of this patent is extended or adjusted under 35 U.S.C. 154(b) by 380 days.

(21) Appl. No.: 10/955,189

(22) Filed: Sep. 29, 2004

(65) Prior Publication Data

US 2006/0075378 A1 Apr. 6, 2006

(51) Int. Cl.
*G06F 17/50* (2006.01)
(52) U.S. Cl. .................................................. 716/21
(58) Field of Classification Search ................ 716/21, 716/19
See application file for complete search history.

(56) References Cited

U.S. PATENT DOCUMENTS 5,847,959 A * 12/1998 Veneklasen et al. ........ 700/121
6,449,103 B1 * 9/2002 Charles ....................... 359/725
7,010,776 B2 * 3/2006 Gallatin et al. ............... 716/19
2005/0015233 A1 * 1/2005 Gordon ......................... 703/13
2005/0091631 A1 * 4/2005 Gallatin et al. ............... 716/20
2005/0273753 A1 * 12/2005 Sezginer ....................... 716/21
2006/0126046 A1 * 6/2006 Hansen ........................ 355/55

* cited by examiner

*Primary Examiner*—Paul Dinh
*Assistant Examiner*—Suchin Parihar
(74) *Attorney, Agent, or Firm*—Park, Vaughan & Fleming LLP

(57) ABSTRACT

One embodiment of the present invention provides a system that calculates etch proximity-correction during an OPC (Optical Proximity Correction) process. During operation, the system receives a layout for an integrated circuit. Next, the system selects a target point on an edge in the layout. The system then casts a plurality of rays from the target point, and constructs a plurality of pie-wedges based on the cast rays. The system then computes a surface integral of a statistical function over the pie-wedges, wherein the surface integral of the statistical function models the etch bias at the target point. Next, the calculated etch proximity-correction is applied to an area in proximity to the target point.

21 Claims, 4 Drawing Sheets

CALCULATING ETCH PROXIMITY-CORRECTION USING IMAGE-PRECISION TECHNIQUES

RELATED APPLICATIONS

The subject matter of this application is related to the subject matter in a non-provisional application by the same inventors as the instant application and filed on the same day as the instant application entitled, "CALCULATING ETCH PROXIMITY-CORRECTION USING OBJECT-PRECISION TECHNIQUES," having Ser. No. 10/955,532, and filing date Sep. 29, 2004.

BACKGROUND

1. Field of the Invention

This invention relates to the process of fabricating semiconductor chips. More specifically, the invention relates to a method and apparatus for calculating etch proximity-correction during the OPC (Optical Proximity Correction) process.

2. Related Art

The relentless miniaturization of integrated circuits has been a key driving force behind recent advances in computer technology. As this miniaturization process causes features on integrated circuits to become progressively smaller, post-lithographic process effects are accounting for an ever-increasing portion of the CD (Critical Dimension) error budget. As a result, accurate modeling of these post-lithographic process effects is becoming increasingly more important during the OPC (Optical Proximity Correction) process.

It is well known that for sub-90 nm processes, resist and etch effects can no longer be treated as a small perturbation on a purely optical OPC model. Hence, OPC models must account for such etch proximity-effects that occur due to the main-etch step and any additional etch steps, such as resist trim, that follow the lithography step.

Etch proximity-effects are determined by the complex physical, transport, and chemical interactions in an etch chamber. Moreover, etch proximity-effects are heavily influenced by the actual layout of the integrated circuit. For example, one important source of etch proximity-effects is the deposition of passivant molecules from the gas phase during etch processing. These passivant molecules move in straight lines through the gas phase and deposit on sidewalls of the features of the integrated circuit. Note that, since these passivant molecules move in straight lines, the geometry of the layout plays a critical role in determining the deposition of the passivant molecules.

Unfortunately, existing OPC models do not calculate etch proximity-correction accurately. These OPC models typically use a function that is empirically-fit to model etch proximity-effects, and they use a linear convolution technique to calculate the etch proximity-correction at the target point. Linear convolution techniques linearly superimpose (add together) the contribution of each polygon to the overall proximity effect. This cannot capture the passivation effect accurately because polygons that are not visible from the target point do not contribute to the proximity effect. Linear convolution techniques cannot distinguish between visible and occluded polygons in every case. As a result, in existing OPC models, the calculated etch proximity-correction lack much of the polygon orientation and the relative placement information needed for modeling of etch proximity. This is the main reason why existing OPC models do not calculate etch proximity-correction accurately.

Hence, what is needed is a method and apparatus for accurately calculating etch proximity-correction by taking into account the orientation and relative placement of the features in the layout.

SUMMARY

One embodiment of the present invention provides a system that calculates etch proximity-correction during an OPC (Optical Proximity Correction) process. During operation, the system receives a layout for an integrated circuit. Next, the system selects a target point on an edge in the layout. The system then casts a plurality of rays from the target point, and constructs a plurality of pie-wedges based on the cast rays. The system then computes a surface integral of a statistical function over the pie-wedges, wherein the surface integral of the statistical function models the etch proximity effects correlated with positions of the edges visible from the target point. Next, the calculated etch proximity-correction is applied to an area in proximity to the target point.

In a variation on this embodiment, the system selects the midpoint of the edge to be the target point.

In a variation on this embodiment, the system casts a plurality of rays at uniform angular increments from the target point.

In a variation on this embodiment, the system constructs a pie-wedge whose radius is equal to the distance from the target point to an intersection point between a ray and an edge of a neighboring polygon.

In a variation on this embodiment, the system constructs a pie-wedge whose radius is equal to the proximity range, which is defined as the maximum length for which a ray is allowed to extend.

In a variation on this embodiment, the statistical function, $f$, is defined as $f(r,\theta)=a/r$, where r is a radial distance from the target point, $\theta$ is the angle between a cast ray and a reference line that passes through the target point, and a is a free parameter that is chosen so that a surface integral of the statistical function accurately models the amount of etch bias at the target point.

In a variation on this embodiment, the statistical function, $f$, is defined as $$f(r,\theta) = ae^{-\left(\frac{r}{b}\right)^2},$$

where r is a radial distance from the target point, $\theta$ is the angle between a cast ray and a reference line that passes through the target point, and a, b are free parameters that are chosen so that a surface integral of the statistical function accurately models the amount of deposition at the target point.

DETAILED DESCRIPTION

Optical Proximity Correction (OPC)

Figure 1:
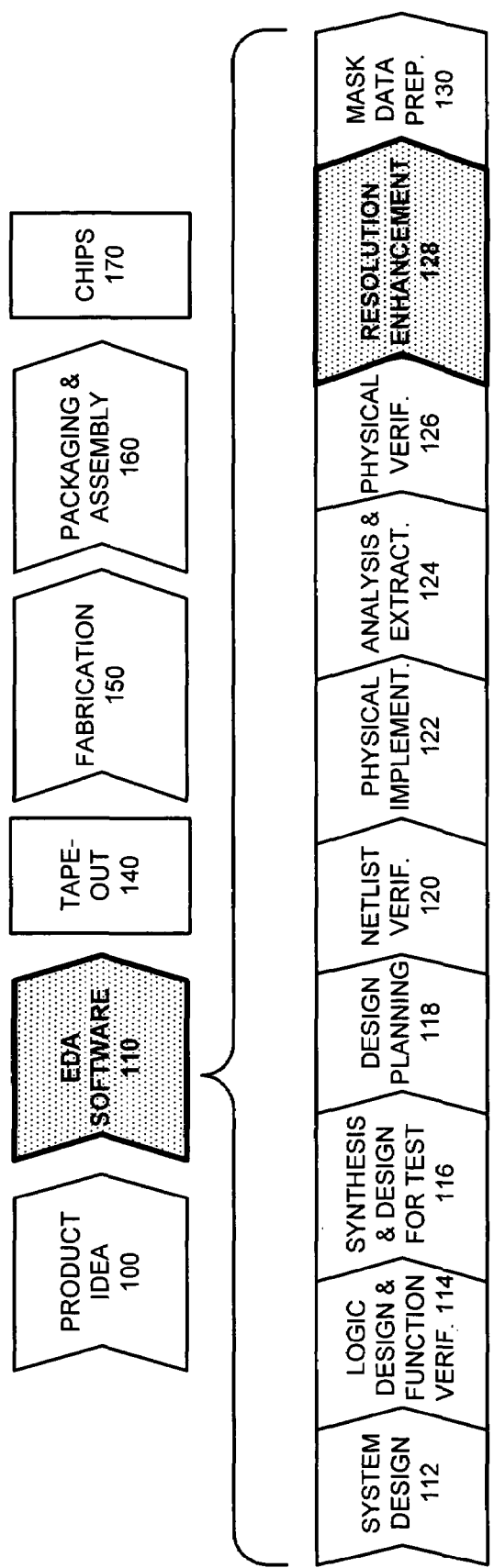
FIG. 1 illustrates the various steps in the design and fabrication of an integrated circuit in accordance with an embodiment of the present invention.

FIG. 1 illustrates the various steps in the design and fabrication of an integrated circuit in accordance with an embodiment of the present invention. The process starts with a product idea (step 100). Next, the product idea is realized by an integrated circuit, which designed using Electronic Design Automation (EDA) software (step 110). Once the design is finalized in software, it is taped-out (step 140). After tape-out, the process goes through fabrication (step 150), packaging, and assembly (step 160). The process eventually culminates with the production of chips (step 170).

The EDA software design step 110, in turn, includes a number of sub-steps, namely, system design (step 112), logic design and function verification (step 114), synthesis and design for test (step 116), design planning (step 118), netlist verification (step 120), physical implementation (step 122), analysis and extraction (step 124), physical verification (step 126), resolution enhancement (step 128), and mask data preparation (step 130).

Optical Proximity Correction (OPC) takes place within the resolution enhancement step 128, which involves geometric manipulations of the layout to improve manufacturability of the design. Contrary to its name, OPC generally refers to proximity corrections for a variety of factors, which include, optical, micro-loading, etch, resist, phase shift mask (PSM), etc. Typically, OPC starts by dissecting the layout into a number of segments (or edges) to identify the critical features. Next, a model-based simulation is performed on each segment (or edge) to predict the pattern that would be generated by the layout. Finally, the required correction is computed for each segment (or edge) by comparing the predicted pattern with the target pattern. Note that, during the OPC process, edges are typically divided into segments. The etch proximity-correction technique discussed in the present application can be applied to edges or segments. Hence, in the present application, the term "edge" is used interchangeably with the term "segment". Furthermore, the term "edge" is used in this application in the broadest possible meaning: an edge represents an arbitrary portion of a layout.

Due to the relentless miniaturization of integrated circuits, OPC has become an indispensable step in the design and fabrication of integrated circuits. Moreover, as miniaturization continues, accurate modeling of post-lithographic process effects, such as etch proximity-effects, is becoming more and more important in OPC.

Etch Proximity Correction

Figure 2:
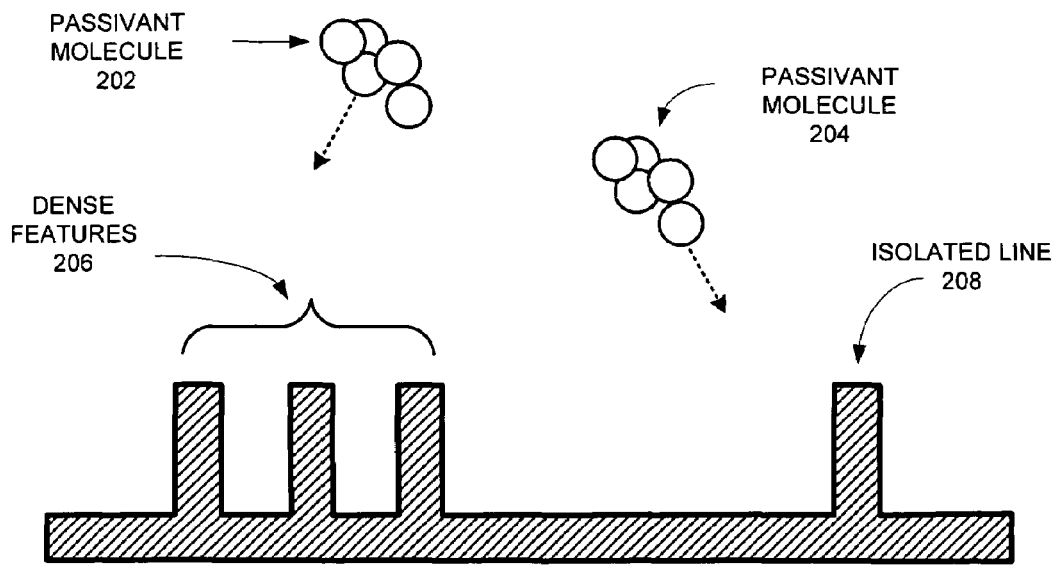
FIG. 2 illustrates the deposition of passivant molecules from the gas phase during etch processing in accordance with an embodiment of the present invention.

FIG. 2 illustrates the deposition of passivant molecules 202 and 204 from the gas phase during etch processing in accordance with an embodiment of the present invention.

Etch proximity-effects are determined by the complex physical, transport, and chemical interactions in an etch chamber. Moreover, etch proximity-effects are heavily influenced by the actual layout of the integrated circuit.

One of the important sources for etch proximity-effects is the deposition of passivant molecules 202 and 204 from the gas phase during etch processing. (Note that, the dotted arrows in FIG. 2 indicate the direction in which the molecules 202 and 204 are moving.) Passivant molecules, such as passivant molecules 202 and 204, may be produced due to the breakdown of the resist. Since the pressure in the etch chamber is very low, these molecules usually move in straight lines, i.e. collisionlessly, through the gas phase.

Furthermore, passivant molecules typically have a high sticking coefficient. As a result, they deposit preferentially on sidewalls adjacent to wide trench areas, such as the sidewall of the isolated line 208. In contrast, the transport of passivant molecules, such as molecule 202, into dense features 206 is limited. It is evident that, since these passivant molecules move in straight lines, the geometry of the layout plays a critical role in determining the deposition of the passivant molecules.

Note that, it is impossible to exactly simulate the complex physical, transport, and chemical interactions in an etch chamber. Moreover, the trench height, which affects the amount of deposition, is also not readily available. Hence, such factors must be modeled using a statistical function.

It will be apparent to one skilled in the art that a variety of statistical functions can be used for modeling such factors. Specifically, in one embodiment of the present invention, the statistical function is chosen so that a surface integral of the statistical function models the amount of deposition of the passivant molecules. Furthermore, in another embodiment of the present invention, the statistical function is chosen so that a surface integral of the statistical function models the etch proximity effects correlated with positions of the edges visible from a target point.

Furthermore, the present invention is not limited to modeling the effect of passivant deposition on etch bias. It will be apparent to one skilled in the art that the present invention can be used to model any etch processing mechanism which depends on the placement and orientation of surfaces visible from the target point.

The deposition of passivant molecules, such as passivant molecules 202 and 204, can inhibit subsequent chemical etching, which can cause the actual pattern to be different from the target pattern. This can deteriorate the manufacturability of the design. Hence, the target pattern needs to be corrected for etch proximity-effects, so that the actual pattern is close to the target pattern.

Figure 3:
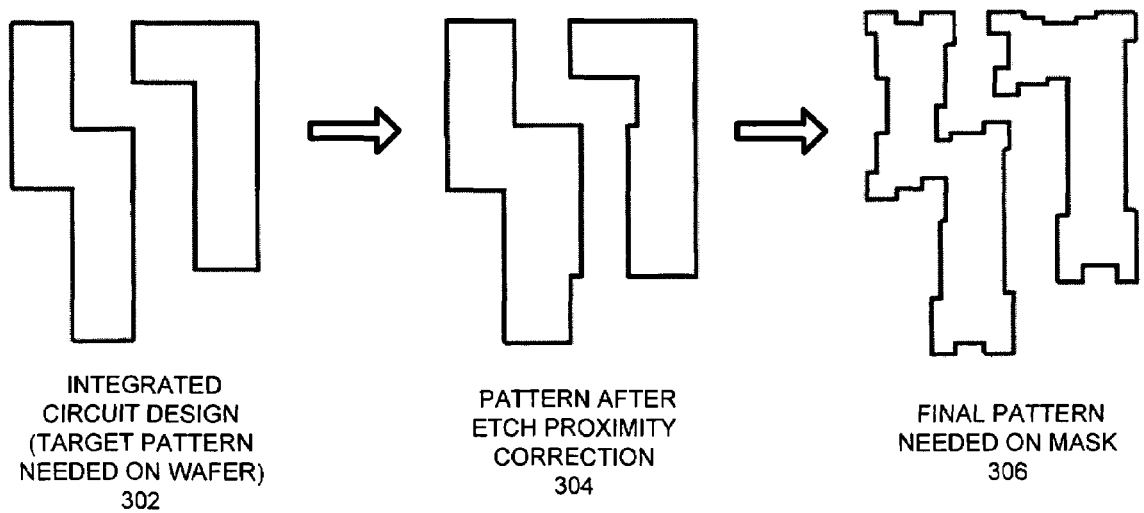
FIG. 3 illustrates various geometric manipulations of the layout that occur during proximity correction in accordance with an embodiment of the present invention.

FIG. 3 illustrates various geometric manipulations of the layout that occur during proximity correction in accordance with an embodiment of the present invention.

FIG. 3 illustrates the integrated circuit design 302, which contains the target pattern that is needed on the wafer. After etch proximity-correction is applied to the integrated circuit design 302, the resulting pattern 304 contains geometric manipulations that are designed to counter etch proximity-effects. Note that, the pattern 304 may subsequently be subjected to other types of proximity corrections. As a result, the final pattern needed on the mask 306 may contain a large number of geometric manipulations that are designed to counter various proximity effects that occur during the fabrication process.

In one embodiment of the present invention, the etch-proximity-effect model is separate from other proximity-effect models. In another embodiment of the present invention, the etch-proximity-effect model is lumped into a single proximity-effect model that additionally contains other proximity-effect models. Furthermore, applying proximity-correction to a pattern can be an iterative process, wherein in each iteration the pattern is geometrically manipulated using a proximity-effect model.

Calculating Etch Proximity-Correction Using Image-Precision Techniques

Figure 4:
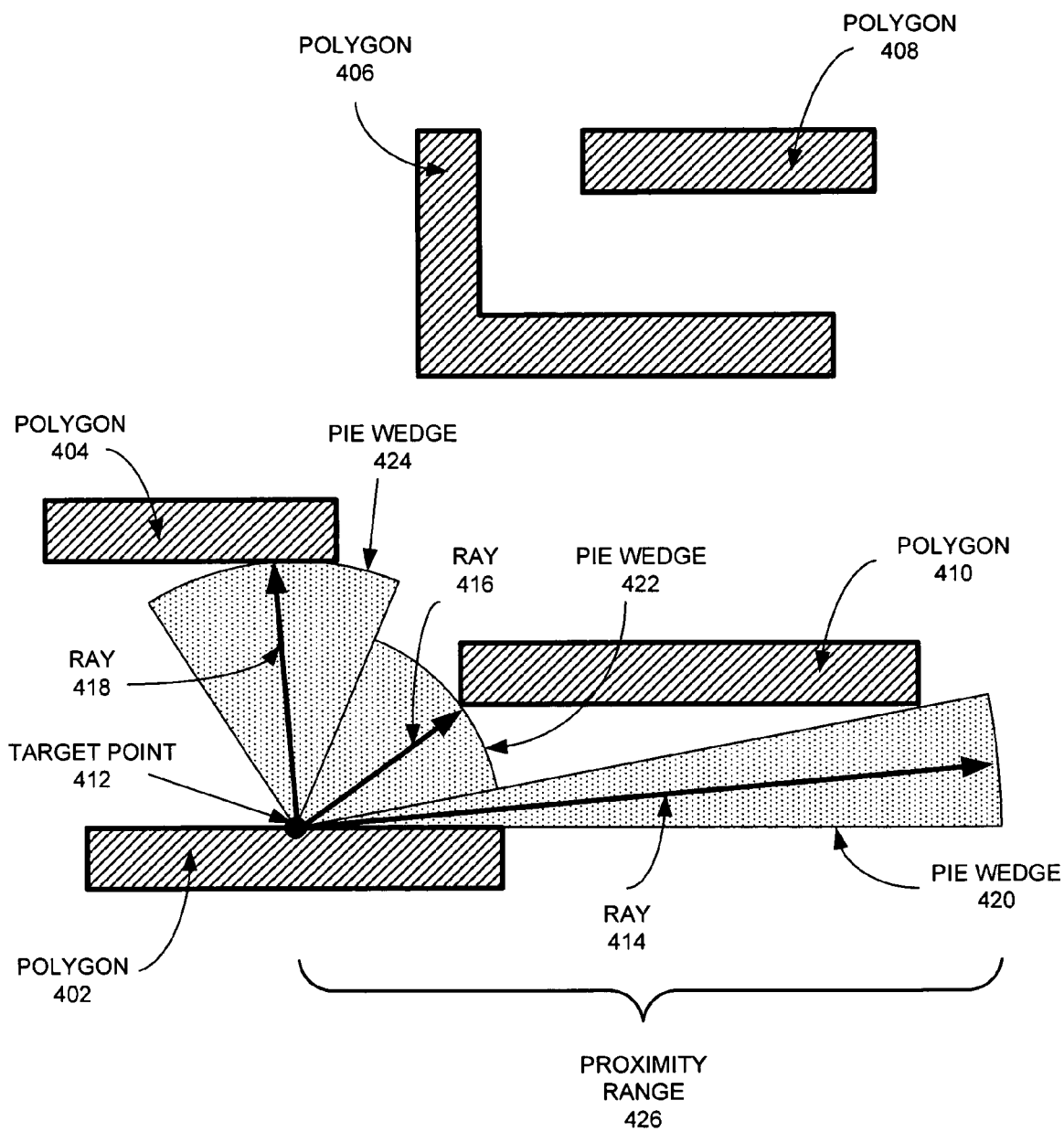
FIG. 4 illustrates multiple polygons, which belong to a portion of a layout of an integrated circuit in accordance with an embodiment of the present invention.

FIG. 4 illustrates multiple polygons 402, 404, 406, 408, and 410, which belong to a portion of a layout of an integrated circuit, in accordance with an embodiment of the present invention. Furthermore, each polygon, such as polygon 402, contains multiple edges.

Etch proximity-correction is computed for an edge of a polygon, such as polygon 402. More specifically, etch proximity-correction is computed for a target point, such as target point 412, on an edge of a polygon, such as polygon 402.

In one embodiment of the present invention, an edge is divided into a plurality of segments, and etch proximity-correction is calculated for a target point on each segment. Furthermore, in one embodiment of the present invention, etch proximity-correction is calculated for multiple target points on an edge of a polygon.

Figure 5:
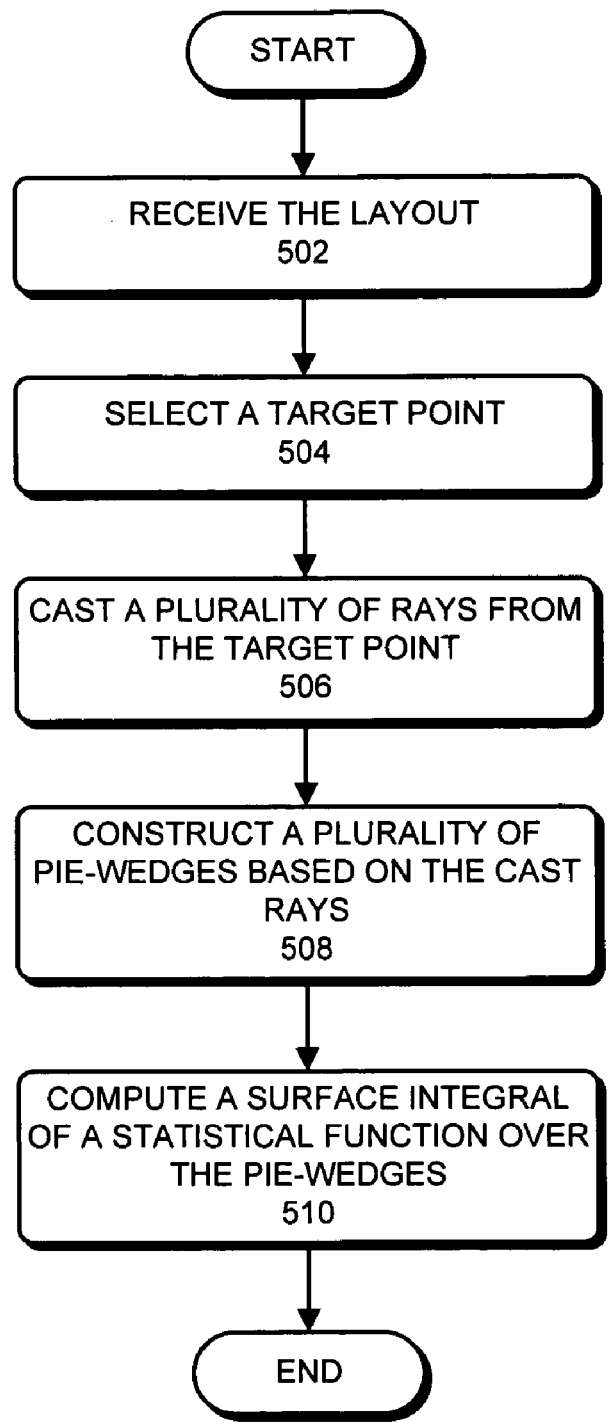
FIG. 5 presents a flowchart that illustrates the process of calculating etch proximity-correction using image-precision techniques in accordance with an embodiment of the present invention.

FIG. 5 presents a flowchart that illustrates the process of calculating etch proximity-correction using image-precision techniques in accordance with an embodiment of the present invention.

The process begins with receiving the layout (step 502). The layout describes the orientation and relative placement of the various polygons, such as polygons 402, 404, 406, 408, and 410, which belong to the integrated circuit.

Next, the system selects a target point 412 (step 504). The target point 412 is located on an edge of a polygon 402 for which etch proximity-correction is to be calculated. In one embodiment of the present invention, the midpoint of an edge of a polygon is selected to be the target point.

The system then casts a plurality of rays 414, 416, and 418, from the target point 412 (step 506). In one embodiment of the present invention, the rays are cast at uniform angular increments from the target point.

Note that, the cast rays extend until they either intersect an edge of a neighboring polygon, or they reach the proximity range 426, which is defined as the maximum length for which a ray is allowed to extend. For example, ray 418 intersects an edge of polygon 404. On the other hand, ray 414 does not intersect an edge of a polygon, but reaches the proximity range 426.

Next, the system constructs a plurality of pie-wedges 420, 422, and 424, based on the cast rays 414, 416, and 418 (step 508), respectively. Specifically, the radius of a pie wedge, such as pie wedge 420, is equal to the length of the corresponding cast ray 414. Moreover, a cast ray 414 is contained within the corresponding pie wedge 420. In one embodiment of the present invention, the cast ray, such as ray 414, bisects the angle of the pie wedge 420.

Finally, the system calculates the etch proximity-correction by computing a surface integral of a statistical function over the pie-wedges (step 510).

In one embodiment of the present invention, the statistical function is inversely proportional to the radial distance from the target point. Specifically, in one embodiment of the present invention, the statistical function, $f$, is defined as $f(r,\theta)=a/r$, where $r$ is a radial distance from the target point, $\theta$ is the angle between a cast ray and a reference line that passes through the target point, and $a$ is a free parameter that is chosen so that a surface integral of the statistical function accurately models the amount of deposition at the target point.

Furthermore, in another embodiment of the present invention, the statistical function, $f$, is a Gaussian function, which is defined as $$f(r,\theta) = ae^{-\left(\frac{r}{b}\right)^2},$$

where $r$ is a radial distance from the target point, $\theta$ is the angle between a cast ray and a reference line that passes through the target point, and $a$, $b$ are free parameters that are chosen so that a surface integral of the statistical function accurately models the amount of deposition at the target point.

Typically, a proximity-correction process begins by dissecting the layout into a number of segments (or edges) to identify the critical features. Next, a model-based simulation is performed on each segment (or edge) to predict the pattern that would be generated by the layout. Finally, the required correction is computed for each segment (or edge) by comparing the predicted pattern with the target pattern. Note that the proximity-correction process can be an iterative process, wherein in each iteration the pattern is geometrically manipulated using the proximity-effect model.

Conclusion

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

What is claimed is:

1. A method for calculating etch proximity-correction during an OPC (Optical Proximity Correction) process, the method comprising:
receiving a layout for an integrated circuit;
selecting a target point on an edge in the layout;
casting a plurality of rays from the target point;
constructing a plurality of pie-wedges based on the cast rays;
computing a surface integral of a statistical function over the pie-wedges, wherein the surface integral of the statistical function models the etch proximity effects correlated with positions of the edges visible from the target point and also models an amount of deposition at the target point; and wherein the calculated etch proximity-correction is applied to an area in proximity to the target point and, as a result, decreases the number of critical dimension errors in an integrated circuit chip.

2. The method of claim 1, wherein selecting the target point on an edge involves selecting the midpoint of the edge to be the target point.

3. The method of claim 1, wherein casting the plurality of rays involves casting a plurality of rays at uniform angular increments from the target point.

4. The method of claim 1, wherein constructing the plurality of pie-wedges involves constructing a pie-wedge whose radius is equal to the distance from the target point to an intersection point between a ray and an edge of a neighboring polygon.

5. The method of claim 1, wherein constructing the plurality of pie-wedges involves constructing a pie-wedge whose radius is equal to the proximity range, which is defined as the maximum length for which a ray is allowed to extend.

6. The method of claim 1, wherein the statistical function, $f$, is defined as $f(r,\theta)=a/r$, where r is a radial distance from the target point, $\theta$ is the angle between a cast ray and a reference line that passes through the target point, and a is a free parameter that is chosen so that a surface integral of the statistical function accurately models the amount of deposition at the target point.

7. The method of claim 1, wherein the statistical function, $f$, is defined as $$f(r, \theta) = ae^{-\left(\frac{r}{b}\right)^2},$$

where r is a radial distance from the target point, $\theta$ is the angle between a cast ray and a reference line that passes through the target point, and a, b are free parameters that are chosen so that a surface integral of the statistical function accurately models the amount of deposition at the target point.

8. A computer-readable storage medium storing instructions that when executed by a computer cause the computer to perform a method for calculating etch proximity-correction during an OPC (Optical Proximity Correction) process, the method comprising:

receiving a layout for an integrated circuit;

selecting a target point on an edge in the layout;

casting a plurality of rays from the target point;

constructing a plurality of pie-wedges based on the cast rays;

computing a surface integral of a statistical function over the pie-wedges, wherein the surface integral of the statistical function models the etch proximity effects correlated with positions of the edges visible from the target point and also model an amount of deposition at the target point; and wherein the calculated etch proximity-correction is applied to an area in proximity to the target point and, as a result, decreases the number of critical dimension errors in an integrated circuit chip.

9. The computer-readable storage medium of claim 8, wherein selecting the target point on an edge involves selecting the midpoint of the edge to be the target point.

10. The computer-readable storage medium of claim 8, wherein casting the plurality of rays involves casting a plurality of rays at uniform angular increments from the target point.

11. The computer-readable storage medium of claim 8, wherein constructing the plurality of pie-wedges involves constructing a pie-wedge whose radius is equal to the distance from the target point to an intersection point between a ray and an edge of a neighboring polygon.

12. The computer-readable storage medium of claim 8, wherein constructing the plurality of pie-wedges involves constructing a pie-wedge whose radius is equal to the proximity range, which is defined as the maximum length for which a ray is allowed to extend.

13. The computer-readable storage medium of claim 8, wherein the statistical function, $f$, is defined as $f(r,\theta)=a/r$, where r is a radial distance from the target point, $\theta$ is the angle between a cast ray and a reference line that passes through the target point, and a is a free parameter that is chosen so that a surface integral of the statistical function accurately models the amount of deposition at the target point.

14. The computer-readable storage medium of claim 8, wherein the statistical function, $f$, is defined as $$f(r, \theta) = ae^{-\left(\frac{r}{b}\right)^2},$$

where r is a radial distance from the target point, $\theta$ is the angle between a cast ray and a reference line that passes through the target point, and a, b are free parameters that are chosen so that a surface integral of the statistical function accurately models the amount of deposition at the target point.

15. An apparatus for calculating etch proximity-correction during an OPC (Optical Proximity Correction) process, the apparatus comprising:

a receiving mechanism configured to receive a layout for an integrated circuit;

a selecting mechanism configured to select a target point on an edge in the layout;

a casting mechanism configured to cast a plurality of rays from the target point;

a constructing mechanism configured to construct a plurality of pie-wedges based on the cast rays;

a computing mechanism configured to compute a surface integral of a statistical function over the pie-wedges, wherein the surface integral of the statistical function models the etch proximity effects correlated with positions of the edges visible from the target point and also models an amount of deposition at the target point; and wherein the calculated etch proximity-correction is applied to an area in proximity to the target point and, as a result, decreases the number of critical dimensional errors in an integrated circuit chip.

16. The apparatus of claim 15, wherein the selecting mechanism is further configured to select the midpoint of the edge to be the target point.

17. The apparatus of claim 15, wherein the casting mechanism is further configured to cast a plurality of rays at uniform angular increments from the target point.

18. The apparatus of claim 15, wherein the constructing mechanism is further configured to construct a pie-wedge whose radius is equal to the distance from the target point to an intersection point between a ray and an edge of a neighboring polygon.

19. The apparatus of claim 15, wherein the constructing mechanism is further configured to construct a pie-wedge whose radius is equal to the proximity range, which is defined as the maximum length for which a ray is allowed to extend.

20. The apparatus of claim 15, wherein the statistical function, $f$, is defined as $f(r,\theta)=a/r$, where r is a radial distance from the target point, $\theta$ is the angle between a cast ray and a reference line that passes through the target point, and a is a free parameter that is chosen so that a surface integral of the statistical function accurately models the amount of deposition at the target point.

21. The apparatus of claim 15, wherein the statistical function, $f$, is defined as $$f(r, \theta) = ae^{-\left(\frac{r}{b}\right)^2},$$

where r is a radial distance from the target point, $\theta$ is the angle between a cast ray and a reference line that passes through the target point, and a, b are free parameters that are chosen so that a surface integral of the statistical function accurately models the amount of deposition at the target point.

* * * * *

UNITED STATES PATENT AND TRADEMARK OFFICE
CERTIFICATE OF CORRECTION

| | | |
|---|---|---|
| PATENT NO. | : 7,207,029 B2 | Page 1 of 1 |
| APPLICATION NO. | : 10/955189 | |
| DATED | : April 17, 2007 | |
| INVENTOR(S) | : Dan Beale | |

It is certified that error appears in the above-identified patent and that said Letters Patent is hereby corrected as shown below:

In claim 8 (at column 7, line 59), please delete the word, "model" and replace with the word --models--.

Signed and Sealed this

Twenty-sixth Day of June, 2007

JON W. DUDAS
*Director of the United States Patent and Trademark Office*